(12) United States Patent
Roth et al.

(10) Patent No.: US 9,660,532 B2
(45) Date of Patent: May 23, 2017

(54) PACKAGE SYSTEMS INCLUDING PASSIVE ELECTRICAL COMPONENTS

(71) Applicant: TAIWAN SEMICONDUCTOR MANUFACTURING COMPANY, LTD., Hsinchu (TW)

(72) Inventors: Alan Roth, Leander, TX (US); Eric Soenen, Austin, TX (US); Chaohao Wang, Stanford, CA (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 15/352,914

(22) Filed: Nov. 16, 2016

(65) Prior Publication Data

US 2017/0063236 A1    Mar. 2, 2017

Related U.S. Application Data

(63) Continuation of application No. 13/597,973, filed on Aug. 29, 2012, now Pat. No. 9,530,761.

(Continued)

(51) Int. Cl.
*H05K 7/10* (2006.01)
*H02M 3/158* (2006.01)
(Continued)

(52) U.S. Cl.
CPC ........ *H02M 3/158* (2013.01); *H01L 23/5226* (2013.01); *H01L 24/05* (2013.01); *H01L 24/29* (2013.01); *H01L 24/45* (2013.01); *H01L 28/10* (2013.01); *H01L 28/40* (2013.01); *H05K 1/111* (2013.01); *H05K 1/181* (2013.01); *H01L 2224/05025* (2013.01); *H01L 2224/05124* (2013.01); *H01L 2224/05147* (2013.01); *H01L 2224/05155* (2013.01); *H01L 2224/05157* (2013.01); *H01L 2224/05166* (2013.01); *H01L 2224/05181* (2013.01);
(Continued)

(58) Field of Classification Search
CPC .... H02M 3/158; H01L 23/5226; H01L 24/05; H01L 24/29; H01L 24/45; H01L 28/10
USPC ......................................... 361/760–764, 767
See application file for complete search history.

(56) References Cited

U.S. PATENT DOCUMENTS 4,811,082 A    3/1989  Jacobs et al.
4,990,462 A    2/1991  Sliwa, Jr.
(Continued)

*Primary Examiner* — Tremesha S Willis
(74) *Attorney, Agent, or Firm* — Hauptman Ham, LLP

(57) ABSTRACT

A converter includes a plurality of active circuitry elements over a substrate. The converter further includes a passivation structure over the plurality of active circuitry elements, the passivation structure having at least one opening that is configured to expose at least one electrical pad of each active circuitry element. The converter further includes a plurality of passive electrical components over the passivation structure, wherein each passive electrical component is selectively connectable with at least one other passive electrical component, and a first side of each passive electrical component is electrically coupled to an electrical pad of each of at least two active circuitry elements. The converter further includes a plurality of electrical connection structures, wherein a first electrical connection structure electrically couples an electrical pad of a first active circuitry element to a corresponding passive electrical component, and the first electrical connection structure is completely within the passivation structure.

20 Claims, 7 Drawing Sheets

Related U.S. Application Data

(60) Provisional application No. 61/530,652, filed on Sep. 2, 2011.

(51) Int. Cl.
| | | |
|---|---|---|
| *H05K 1/18* | (2006.01) | |
| *H05K 1/11* | (2006.01) | |
| *H01L 49/02* | (2006.01) | |
| *H01L 23/522* | (2006.01) | |
| *H01L 23/00* | (2006.01) | |

(52) U.S. Cl.
CPC ........... *H01L 2224/05184* (2013.01); *H01L 2224/2919* (2013.01); *H01L 2224/29025* (2013.01); *H01L 2224/4502* (2013.01); *H01L 2224/45111* (2013.01); *H01L 2224/45116* (2013.01); *H01L 2224/45124* (2013.01); *H01L 2224/45139* (2013.01); *H01L 2224/45144* (2013.01); *H01L 2224/45147* (2013.01); *H01L 2924/048* (2013.01); *H01L 2924/0479* (2013.01); *H01L 2924/04941* (2013.01); *H01L 2924/04953* (2013.01); *H01L 2924/1205* (2013.01); *H01L 2924/1206* (2013.01); *H01L 2924/1207* (2013.01); *H01L 2924/1427* (2013.01); *H01L 2924/14252* (2013.01); *H05K 2201/1003* (2013.01); *H05K 2201/10015* (2013.01); *H05K 2201/10022* (2013.01)

(56) References Cited

U.S. PATENT DOCUMENTS

| | | | |
|---|---|---|---|
| 5,075,253 | A | 12/1991 | Sliwa, Jr. |
| 5,380,681 | A | 1/1995 | Hsu |
| 5,481,133 | A | 1/1996 | Hsu |
| 6,002,177 | A | 12/1999 | Gaynes et al. |
| 6,187,678 | B1 | 2/2001 | Gaynes et al. |
| 6,229,216 | B1 | 5/2001 | Ma et al. |
| 6,236,115 | B1 | 5/2001 | Gaynes et al. |
| 6,271,059 | B1 | 8/2001 | Bertin et al. |
| 6,279,815 | B1 | 8/2001 | Correia et al. |
| 6,355,501 | B1 | 3/2002 | Fung et al. |
| 6,434,016 | B2 | 8/2002 | Zeng et al. |
| 6,448,661 | B1 | 9/2002 | Kim et al. |
| 6,461,895 | B1 | 10/2002 | Liang et al. |
| 6,562,653 | B1 | 5/2003 | Ma et al. |
| 6,570,248 | B1 | 5/2003 | Ahn et al. |
| 6,600,222 | B1 | 7/2003 | Levardo |
| 6,607,938 | B2 | 8/2003 | Kwon et al. |
| 6,661,085 | B2 | 12/2003 | Kellar et al. |
| 6,762,076 | B2 | 7/2004 | Kim et al. |
| 6,790,748 | B2 | 9/2004 | Kim et al. |
| 6,887,769 | B2 | 5/2005 | Kellar et al. |
| 6,908,565 | B2 | 6/2005 | Kim et al. |
| 6,908,785 | B2 | 6/2005 | Kim |
| 6,924,551 | B2 | 8/2005 | Rumer et al. |
| 6,943,067 | B2 | 9/2005 | Greenlaw |
| 6,946,384 | B2 | 9/2005 | Kloster et al. |
| 6,975,016 | B2 | 12/2005 | Kellar et al. |
| 7,037,804 | B2 | 5/2006 | Kellar et al. |
| 7,056,807 | B2 | 6/2006 | Kellar et al. |
| 7,087,538 | B2 | 8/2006 | Staines et al. |
| 7,151,009 | B2 | 12/2006 | Kim et al. |
| 7,157,787 | B2 | 1/2007 | Kim et al. |
| 7,215,033 | B2 | 5/2007 | Lee et al. |
| 7,276,799 | B2 | 10/2007 | Lee et al. |
| 7,279,795 | B2 | 10/2007 | Periaman et al. |
| 7,307,005 | B2 | 12/2007 | Kobrinsky et al. |
| 7,317,256 | B2 | 1/2008 | Williams et al. |
| 7,320,928 | B2 | 1/2008 | Kloster et al. |
| 7,345,350 | B2 | 3/2008 | Sinha |
| 7,402,442 | B2 | 7/2008 | Condorelli et al. |
| 7,402,515 | B2 | 7/2008 | Arana et al. |
| 7,410,884 | B2 | 8/2008 | Ramanathan et al. |
| 7,432,592 | B2 | 10/2008 | Shi et al. |
| 7,494,845 | B2 | 2/2009 | Hwang et al. |
| 7,528,494 | B2 | 5/2009 | Furukawa et al. |
| 7,531,890 | B2 | 5/2009 | Kim |
| 7,557,597 | B2 | 7/2009 | Anderson et al. |
| 7,576,435 | B2 | 8/2009 | Chao |
| 7,834,450 | B2 | 11/2010 | Kang |
| 2007/0076391 | A1 | 4/2007 | Hsu |
| 2008/0047740 | A1 | 2/2008 | Lien |
| 2011/0169163 | A1 | 7/2011 | Liou et al. |
| 2012/0146209 | A1 | 6/2012 | Hu et al. |

# PACKAGE SYSTEMS INCLUDING PASSIVE ELECTRICAL COMPONENTS

PRIORITY CLAIM

The present application is a continuation of U.S. application Ser. No. 13/597,973, filed Aug. 29, 2012, which claims priority of U.S. Provisional Application No. 61/530,652, filed Sep. 2, 2011, which are incorporated herein by reference in their entireties.

TECHNICAL FIELD

The present disclosure relates generally to the field of semiconductor and, more particularly, to package systems including passive electrical components.

BACKGROUND

Portable devices, such as mobile phones, laptops, etc., are widely used, and are equipped with various functionalities. For example, mobile phones are used to place telephone calls, take photographs, access the Internet, send and receive email, check stock quotes and sports scores, as well as operate as a personal digital assistant (or PDA) and/or MP3 player.

BRIEF DESCRIPTION OF THE DRAWINGS

The present disclosure is understood from the following detailed description when read with the accompanying figures. It is noted that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

Figure 1:
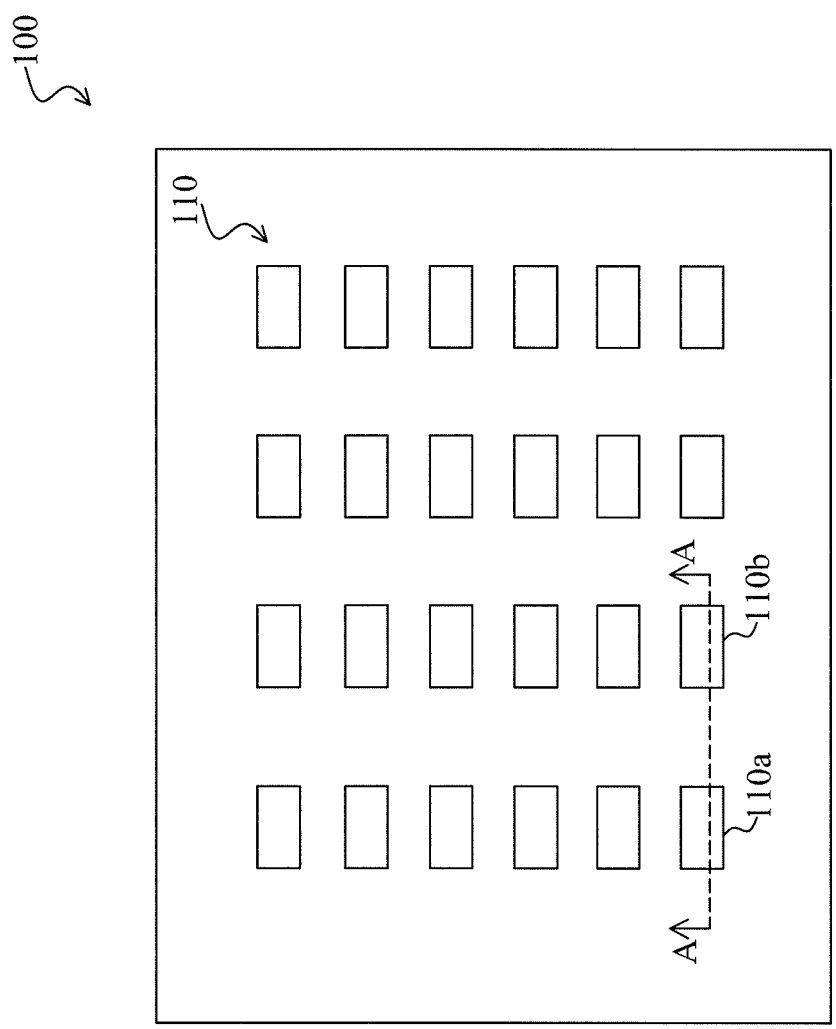
FIG. 1 is a schematic top view of an exemplary package system.

Portable devices usually are powered by small batteries so as to be carried easily and lightly. The batteries are configured to provide a voltage level of around, e.g., 3.6 V, depending on the type of the portable device. To supply power to integrated circuits in the portable device, the battery voltage is regulated down to a small voltage, e.g., 1 V. In some techniques, a DC/DC converter which includes inductors is adopted to regulate the battery voltage.

A DC/DC converter that is known to the applicants includes a plurality of discrete inductors. To regulate the battery voltage, the inductors are bonded on a printed circuit board (PCB). The inductors are wired bonded with the PCB to electrically communicate with other circuitries that are also bonded on the PCB. Applicants found that the discrete inductors are expensive. Additionally, the discrete inductors are disposed on a certain area of the PCB, leaving large footprints on the PCB. Applicants also found that due to the wire bonding, the efficiency of the DC/DC converter may not reach a desired level.

It is understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic top view of an exemplary package system. In FIG. 1, a package system 100 includes a plurality of passive electrical components 110 that are disposed over a surface of a passivation structure (not labeled). In some embodiments, the passive electrical components 110 are arranged in an array fashion. In some embodiments, at least two of the passive electrical components 110 are electrically coupled to each other in a parallel or series fashion. In other embodiments, the passive electrical components 110 are electrically isolated from each other. The passive electrical components 110 each can be a capacitor, an inductor or a resistor.

Figure 2A:
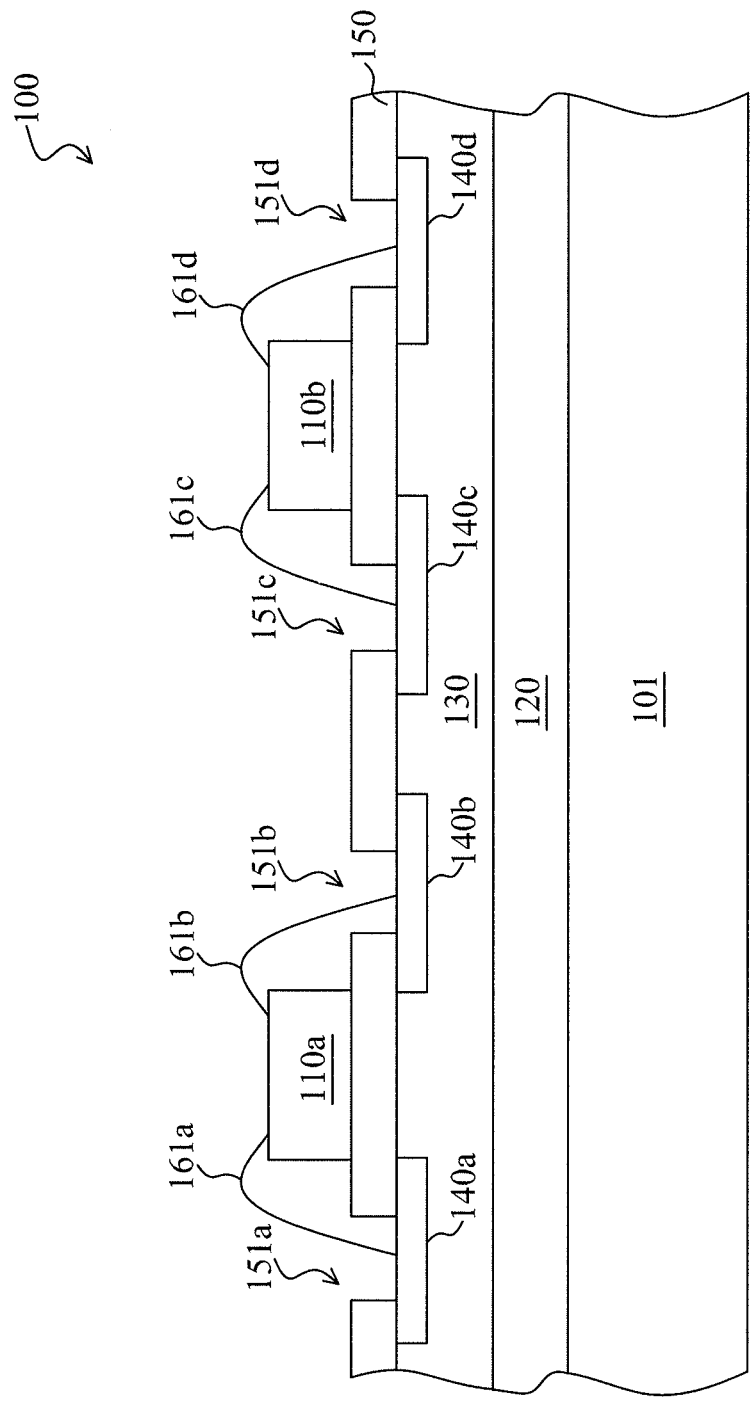
FIGS. 2A-2C are schematic cross-sectional views of various exemplary package systems taken along section line A-A of FIG. 1

FIG. 2A is a schematic cross-sectional view of a first exemplary package system taken along section line A-A of FIG. 1. In FIG. 2A, the package system 100 includes at least one active circuitry, e.g., an active circuitry 120 that is disposed over a substrate 101. In some embodiments, the active circuitry 120 includes at least one switch, at least one logic circuitry, at least one controller, at least one analog circuitry, at least one mixed-signal circuitry, at least one processor, other active circuitries, and/or any combinations thereof.

Figure 3A:
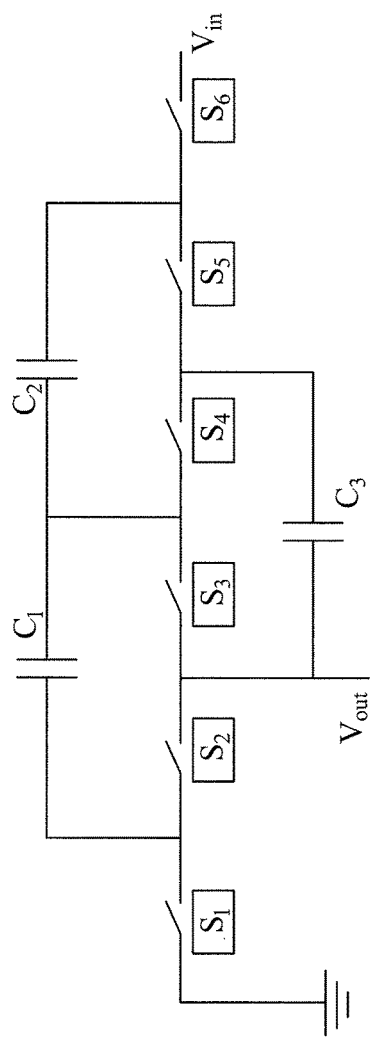
FIGS. 3A-3E are schematic drawings of various exemplary DC/DC converters.
Figure 3B:
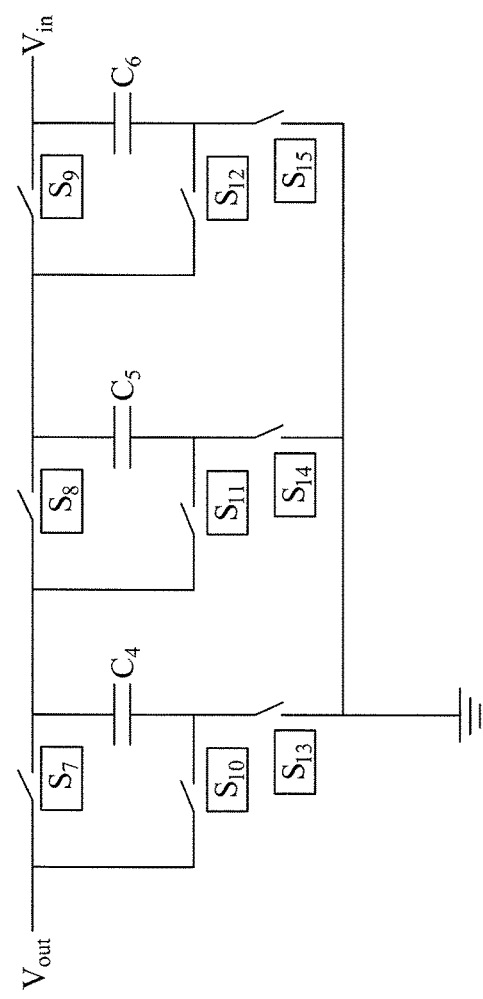
Figure 3C:
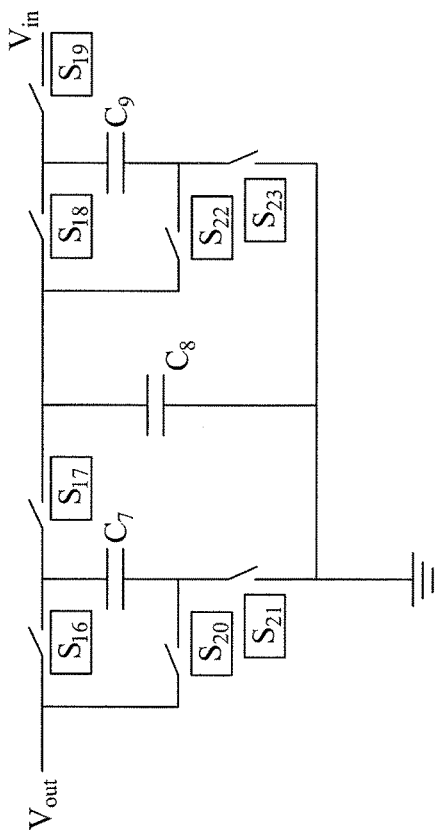
Figure 3D:
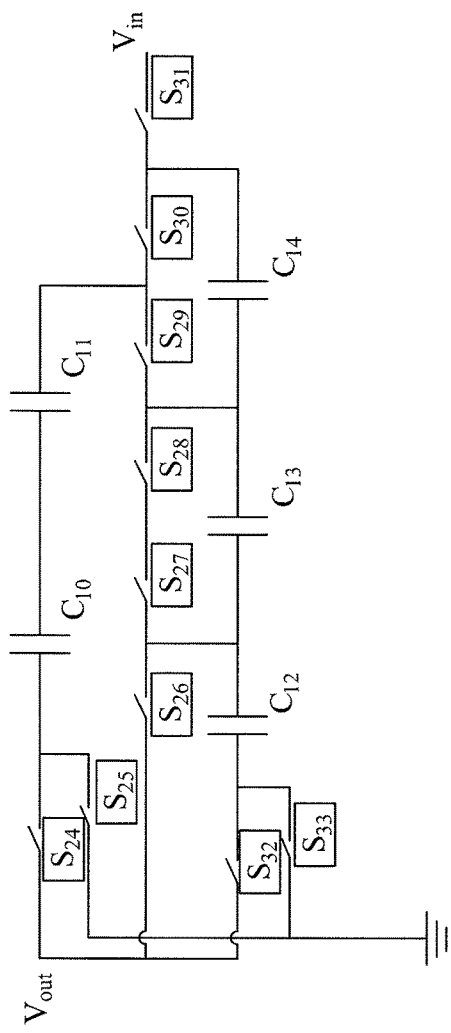
Figure 3E:
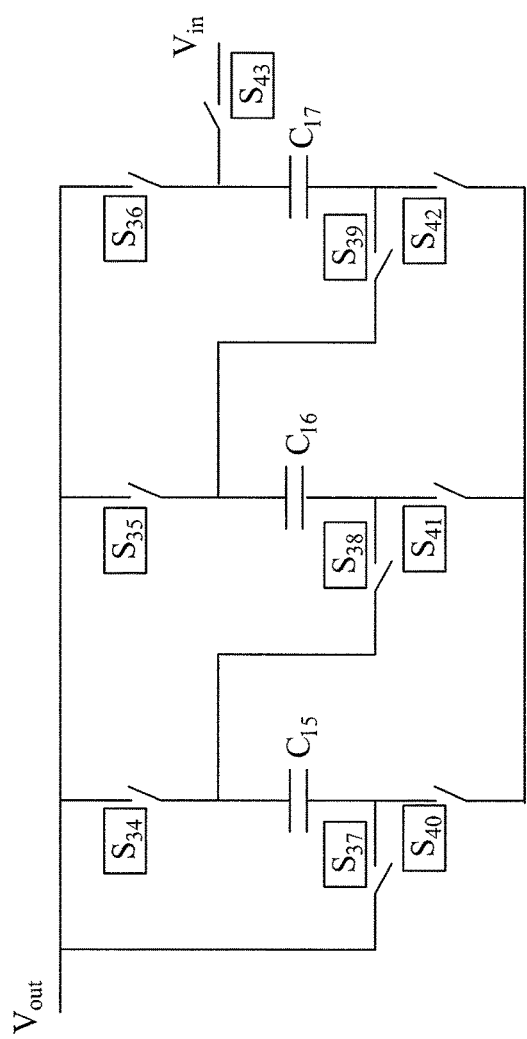

For example, the package system 100 includes a DC/DC converter. The active circuitry 120 includes one or more switches that are operable to electrically couple one or more of the passive electrical components 110 to each other. FIGS. 3A-3E are schematic drawing of various types of exemplary DC/DC converters. In FIG. 3A, the active circuitry 120 includes switches $S_1$-$S_6$ and the passive electrical components 110 includes capacitors $C_1$-$C_3$. In FIG. 3B, the active circuitry 120 includes switches $S_7$-$S_{15}$ and the passive electrical components 110 includes capacitors $C_4$-$C_6$. In FIG. 3C, the active circuitry 120 includes switches $S_{16}$-$S_{23}$ and the passive electrical components 110 includes capacitors $C_7$-$C_9$. In FIG. 3D, the active circuitry 120 includes switches $S_{24}$-$S_{33}$ and the passive electrical components 110 includes capacitors $C_{10}$-$C_{14}$. In FIG. 3E, the active circuitry 120 includes switches $S_{34}$-$S_{43}$ and the passive electrical components 110 includes capacitors $C_{15}$-$C_{17}$.

In some embodiments, the capacitors $C_1$-$C_{17}$ each have a capacitance ranging from about 100 nanofarad (nF) to about 5 micro farad ( µF). By using one of the various DC/DC converters shown in FIGS. 3A-3E, an input voltage ($V_{in}$), e.g., 3.6 V from a battery can be regulated down to an output voltage ($V_{out}$) of about 1 V that is supplied to the active circuitry 120. In some embodiments, the capacitors $C_1$-$C_{17}$ each are a surface-mount device (SMD) capacitor. It is noted that the various types of the DC/DC converters described above in conjunction with FIGS. 3A-3E are merely exemplary. In some embodiments, the passive electrical components 110 and the active circuitry 120 are arranged to form different DC/DC converters. In other embodiments, one or more inductors are used in place of one or more of the capacitors $C_1$-$C_{17}$ to regulate the battery.

Figure 3F:
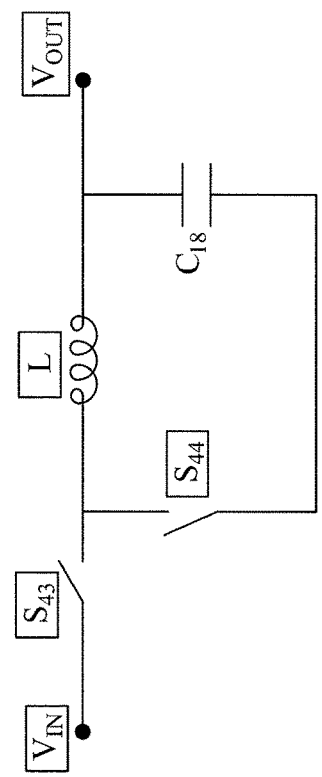
FIG. 3F is a schematic drawing of an exemplary inductive switch regulator.

In some embodiments, the package system 100 includes an inductive switch regulator as shown in FIG. 3F. The active circuitry 120 includes switches $S_{43}$ and $S_{44}$ that are operable to electrically couple one or more of a capacitor $C_{18}$ and an inductor L to each other. It is noted that the DC/DC converters and the inductive switch regulator described above in conjunction with FIGS. 3A-3F are merely exemplary. The scope of the application is not limited thereto. In some embodiments, the package system 100 includes at least one of a boost switch regulator, a buck converter, other types of regulators or converters, other circuitries that include passive electrical components, and/or any combinations thereof.

In some embodiments, the substrate 101 is made of an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In one embodiment, the alloy semiconductor substrate has a gradient SiGe feature in which the Si and Ge composition change from one ratio at one location to another ratio at another location of the gradient SiGe feature. In another embodiment, the alloy SiGe is formed over a silicon substrate. In yet another embodiment, a SiGe substrate is strained. In some embodiments, the semiconductor substrate has a semiconductor on insulator structure, such as a silicon on insulator (SOI) structure. In some examples, the semiconductor substrate includes a doped epi layer or a buried layer. In other examples, the compound semiconductor substrate has a multilayer structure, or the substrate includes a multilayer compound semiconductor structure.

Referring to FIG. 2A, an interconnect structure 130 is disposed over the active circuitry 120. In some embodiments, the interconnect structure 130 includes at least one dielectric layer and at least one electrical connection structure (not shown). For example, the interconnect structure 130 includes multiple dielectric layers and multiple layers of electrical connection structures. The electrical connection structures each are between two dielectric layers. The electrical connection structures are configured to provide electrical connection among transistors, diodes, devices, circuitries, and/or other electrical components of the active circuitry 120. In some embodiments, the dielectric layers and the conductive structures are arranged to form various passive devices, e.g., capacitors, resistors, and/or inductors.

In some embodiments, the dielectric layers include at least one material, such as silicon oxide, silicon nitride, silicon oxynitride, low dielectric constant (low-k) dielectric material, ultra low-k dielectric material, other dielectric materials, and/or any combinations thereof. The electrical connection structures include at least one structure, such as via plugs, contact plugs, damascene structures, dual damascene structures, metallic regions, metallic lines, metallic slats, other electrical connection structures, and/or any combinations thereof. In some embodiments, the via plugs, contact plugs, damascene structures, dual damascene structures, metallic regions, metallic lines, and metallic slats are made of at least one material, such as tungsten, aluminum, copper, titanium, tantalum, titanium nitride, tantalum nitride, nickel silicide, cobalt silicide, other proper conductive materials, and/or combinations thereof.

Referring again to FIG. 2A, a passivation structure 150 is disposed over the active circuitry 120. The passivation structure 150 has at least one opening, e.g., openings 151a-151d configured to expose at least one electrical pad, e.g., electrical pads 140a-140d, respectively. In some embodiments, the electrical pads 140a-140d are electrically coupled with the active circuitry 120 through the interconnect structure 130.

In some embodiments, the electrical pads 140a-140d are made of at least one material, such as copper (Cu), aluminum (Al), aluminum copper (AlCu), aluminum silicon copper (AlSiCu), tungsten, aluminum, copper, titanium, tantalum, titanium nitride, tantalum nitride, nickel silicide, cobalt silicide, other conductive materials, and/or any combinations thereof. In some embodiments, the electrical pads 140a-140d each include an under bump metallization (UBM) layer (not shown).

In some embodiments, the passivation structure 150 includes at least one dielectric layer and/or at least one polymer layer. The dielectric layer can include a material such as oxide, nitride, oxynitride, other dielectric materials, and/or any combinations thereof. The polymer layer can include a material such as thermoplastic, thermoset, elastomer, coordination polymer, other suitable polymers, and/or any combinations thereof. In some embodiments, the passivation structure 150 is a single layer structure. In other embodiments, the passivation structure 150 is a multi-layer structure.

Referring to FIG. 2A, the passive electrical components 110a and 110b are disposed over the passivation structure 150. In some embodiments, an adhesive material, e.g., epoxy (not shown) is disposed between the respective passive electrical components 110a and 110b and the passivation structure 150. The adhesive material is applied to facilitate the physical connection between the passive electrical components 110a and 110b and the passivation structure 150.

Referring again to FIG. 2A, the passive electrical components 110a and 110b are electrically coupled with the respective electrical pads 140a-140d. For example, the passive electrical component 110a is electrically coupled with the electrical pads 140a and 140b through wires 161a and 161b, respectively. The passive electrical component 110b is electrically coupled with the electrical pads 140c and 140d through wires 161c and 161d, respectively. In some embodiments, the wires 161a and 161b are electrically coupled with opposite nodes of the passive electrical component 110a, and the wires 161c and 161d are electrically coupled with opposite nodes of the passive electrical component 110b. In some embodiments, the wires 161a-161d are made of at least one material such as gold, copper, aluminum, tin, silver, lead, other metallic materials, and/or any combinations thereof.

Referring to FIG. 2A, the package system 100 can be disposed over a printed circuit board (PCB). As noted, the passive electrical components 110a and 110b are disposed over the passivation structure 150. The passive electrical components 110a and 110b do not consume any space of the PCB, such that more space on the PCB can be available to accommodate other circuitries. Little or no footprint of the passive electrical components 110a and 110b is left on the PCB.

As the passive electrical components 110a and 110b are disposed over the passivation structure 150 and electrically coupled with the active circuitry 120 through the electrical pads 140a-140d, the electrical communication speed between the passive electrical components 110a and 110b and the active circuitry 120 is increased. In some embodiments, the passive electrical components 110a and 110b are SMD capacitors which are cheaper than discrete inductors that were used and disposed on a PCB. In contrast, in accordance with one or more of the embodiments, the cost of manufacturing discrete inductors disposed on a PCB is expensive and the discrete inductors occupy a large area of the circuit board, which can minimize the space available to accommodate other circuitries or to reduce the size of the package system 100. The cost of manufacturing the package system 100 can be desirably reduced.

Figure 2B:
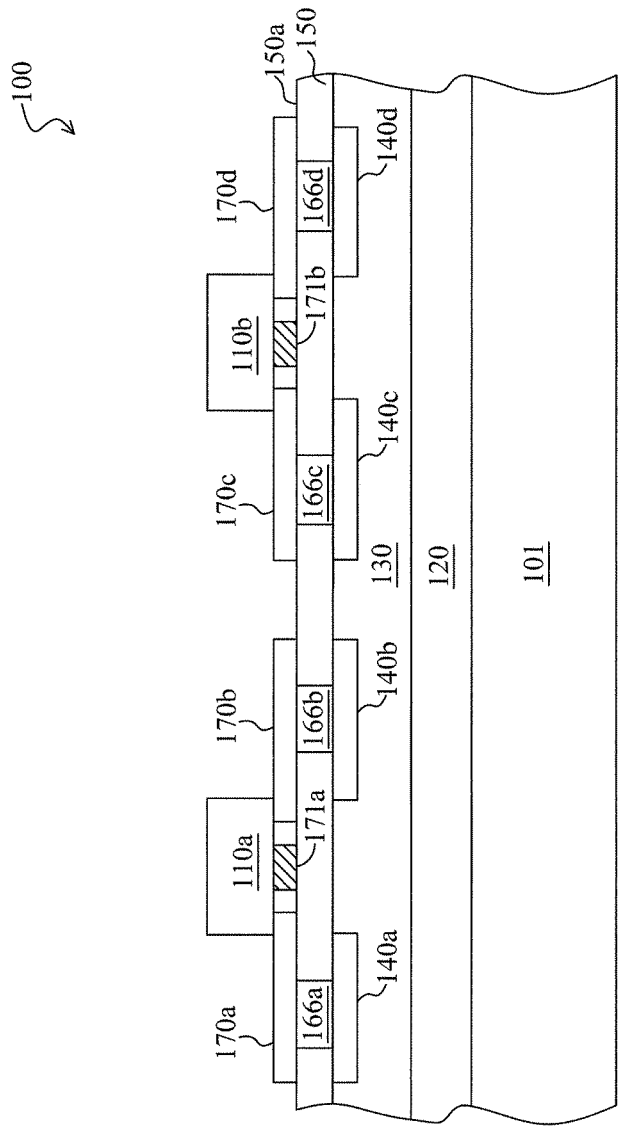

FIG. 2B is a schematic cross-sectional view of a second exemplary package system taken along section line A-A of FIG. 1. Items of the package system 100 in FIG. 2B that are the same or similar items of the package system 100 in FIG. 2A are indicated by the same reference numerals. In FIG. 2B, the package system 100 includes electrical connection structures 166a-166d disposed in the respective openings of the passivation structure 150. In some embodiments, the electrical connection structures 166a-166d each are a via plug, a contact plug, a damascene structure, a dual damascene structure, a metallic region, a metallic line, a metallic slat, or one of other electrical connection structures. In some embodiments, the via plugs, contact plugs, damascene structures, dual damascene structures, metallic regions, metallic lines, and metallic slats are made of at least one material, such as tungsten, aluminum, copper, titanium, tantalum, titanium nitride, tantalum nitride, nickel silicide, cobalt silicide, other proper conductive materials, and/or any combinations thereof.

Referring to FIG. 2B, at least one electrical pad, e.g., electrical pads 170a-170d are disposed over and electrically coupled with the electrical connection structures 166a-166d, respectively. The electrical pads 170a-170d are separated from each other. In some embodiments, the electrical pads 170a-170d are made of at least one material such as copper (Cu), aluminum (Al), aluminum copper (AlCu), aluminum silicon copper (AlSiCu), tungsten, titanium, tantalum, titanium nitride, tantalum nitride, nickel silicide, cobalt silicide, other conductive materials, and/or any combinations thereof.

Referring again to FIG. 2B, the passive electrical component 110a is disposed over and electrically coupled with the electrical pads 170a and 170b. The passive electrical component 110b is disposed over and electrically coupled with the electrical pads 170c and 170d. In some embodiments, the electrical pads 170a and 170b are electrically coupled with opposite nodes of the passive electrical component 110a, and the electrical pads 170c and 170d are electrically coupled with opposite nodes of the passive electrical component 110b.

In some embodiments, adhesive materials 171a and 171b are optionally disposed between the passive electrical component 110a and the passivation structure 150 and between the passive electrical component 110b and the passivation structure 150, respectively. The adhesive material 171a is disposed between and separated from the electrical pads 170a and 170b. The adhesive material 171b is disposed between and separated from the electrical pads 170c and 170d. In some embodiments, the adhesive materials 171a and 171b can include a material such as a thermosetting resin to facilitate connection between the passive electrical components 110a and 110b and the passivation structure 150.

It is noted that the configuration of the electrical connection structures 166a-166d, the electrical pads 170a-170d, the adhesive materials 171a and 171b, and/or the passive electrical components 110a and 110b described above in conjunction with FIG. 2B is merely exemplary. The scope of this application is not limited thereto. In some embodiments, the electrical connection structures 166a-166d continuously extend over a surface 150a of the passivation structure 150.

Figure 2C:
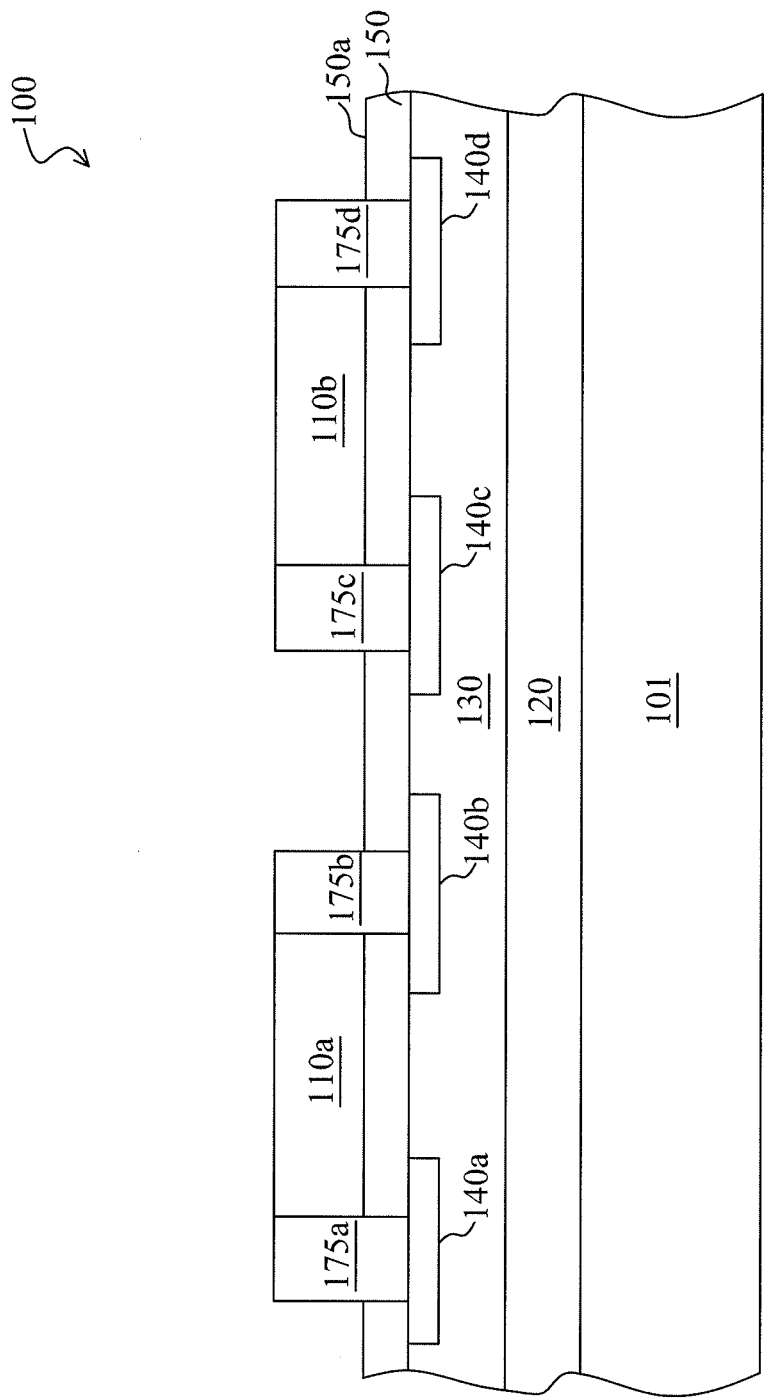

FIG. 2C is a schematic cross-sectional view of a third exemplary package system taken along section line A-A of FIG. 1. Items of the package system 100 in FIG. 2C that are the same or similar items of the package system 100 in FIG. 2A are indicated by the same reference numerals. In FIG. 2C, the package system 100 includes electrical connection structures 175a-175d disposed in the respective openings of the passivation structure 150 and continuously extend above the surface 150a of the passivation structure 150. In some embodiments, the electrical connection structures 175a-175d each are a via plug, a contact plug, a damascene structure, a dual damascene structure, a metallic region, a metallic line, a metallic slat, or one of other electrical connection structures. In some embodiments, the via plugs, contact plugs, damascene structures, dual damascene structures, metallic regions, metallic lines, and metallic slats are made of at least one material, such as tungsten, aluminum, copper, titanium, tantalum, titanium nitride, tantalum nitride, nickel silicide, cobalt silicide, other proper conductive materials, and/or any combinations thereof.

Referring to FIG. 2C, the passive electrical component 110a is disposed between and electrically coupled with the electrical connection structures 175a and 175b. The passive electrical component 110b is disposed between and electrically coupled with the electrical connection structures 175c and 175d. In some embodiments, the electrical connection structures 175a and 175b are electrically coupled with opposite nodes of the passive electrical component 110a, and the electrical connection structures 175c and 175d are electrically coupled with opposite nodes of the passive electrical component 110b.

In some embodiments, the top surface of the passive electrical component 110a is substantially leveled with the top surfaces of the electrical connection structures 175a and 175b. In other embodiments, the top surface of the passive electrical component 110a is higher or lower than the top surfaces of the electrical connection structures 175a and 175b.

It is noted that though the package system 100 of FIGS. 2A-2B shows that the passive electrical components 110a and 110b are disposed directly on or over the passivation structure 150, the scope of this application is not limited thereto. In some embodiments, other dielectric layers and/or materials are disposed between the passive electrical components 110a and 110b and the passivation structure 150. In other embodiments, at least one interposer and/or additional die is disposed between the passive electrical components 110a and 110b and the passivation structure 150. In still other embodiments, at least one interposer and/or additional die is disposed over the passive electrical components 110a and 110b.

One aspect of this description relates to a converter. The converter includes a plurality of active circuitry elements over a substrate. The converter further includes a passivation structure over the plurality of active circuitry elements, the passivation structure having at least one opening that is configured to expose at least one electrical pad of each active circuitry element of the plurality of active circuitry elements. The converter further includes a plurality of passive electrical components over the passivation structure, wherein each passive electrical component of the plurality of passive electrical components is selectively connectable with at least one other passive electrical component of the plurality of electrical components, and a first side of each passive electrical component of the plurality of electrical components is electrically coupled to an electrical pad of each of at least two active circuitry elements of the plurality of active circuitry elements. The converter further includes a plurality of electrical connection structures, wherein a first electrical connection structure of the plurality of electrical connection structures electrically couples an electrical pad of a first active circuitry element of the plurality of active circuitry elements to a corresponding passive electrical component of the plurality of passive electrical components, and the first electrical connection structure is completely within the passivation structure.

Another aspect of this description relates to a converter. The converter includes a plurality of active circuitry elements over a substrate. The converter further includes a passivation structure over the plurality of active circuitry elements, the passivation structure having at least one opening that is configured to expose at least one electrical pad of each active circuitry element of the plurality of active circuitry elements. The converter further includes a plurality of passive electrical components over the passivation structure, wherein each passive electrical component of the plurality of passive electrical components is selectively connectable with at least one other passive electrical component of the plurality of electrical components, and a first side of each passive electrical component of the plurality of electrical components is electrically coupled to an electrical pad of each of at least two active circuitry elements of the plurality of active circuitry elements. The converter further includes a plurality of electrical connection structures, wherein a first electrical connection structure of the plurality of electrical connection structures electrically couples an electrical pad of a first active circuitry element of the plurality of active circuitry elements to a first passive electrical component of the plurality of passive electrical components, a second electrical connection structure of the plurality of electrical connection structures electrically couples an electrical pad of a second active circuitry element of the plurality of active circuitry elements to the first passive electrical component, and the first passive electrical component is between the first electrical connection structure and the second electrical connection structure.

Still another aspect of this description relates to a converter. The converter includes a plurality of active circuitry elements over a substrate. The converter further includes a passivation structure over the plurality of active circuitry elements, the passivation structure having at least one opening that is configured to expose at least one electrical pad of each active circuitry element of the plurality of active circuitry elements. The converter further includes a plurality of passive electrical components over the passivation structure, wherein a first side of each passive electrical component of the plurality of electrical components is electrically coupled to an electrical pad of each of at least two active circuitry elements of the plurality of active circuitry elements. The converter further includes a plurality of electrical connection structures, wherein a first electrical connection structure of the plurality of electrical connection structures electrically couples an electrical pad of a first active circuitry element of the plurality of active circuitry elements to a first passive electrical component of the plurality of passive electrical components, a second electrical connection structure of the plurality of electrical connection structures electrically couples an electrical pad of a second active circuitry element of the plurality of active circuitry elements to the first passive electrical component, and the first electrical connection structure and the second electrical connection structure are both over the passivation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A converter comprising:
a plurality of active circuitry elements over a substrate;
a passivation structure over the plurality of active circuitry elements, the passivation structure having at least one opening that is configured to expose at least one electrical pad of each active circuitry element of the plurality of active circuitry elements;
a plurality of passive electrical components over the passivation structure, wherein each passive electrical component of the plurality of passive electrical components is selectively connectable with at least one other passive electrical component of the plurality of electrical components, and a first side of each passive electrical component of the plurality of electrical components is electrically coupled to an electrical pad of each of at least two active circuitry elements of the plurality of active circuitry elements; and
a plurality of electrical connection structures, wherein a first electrical connection structure of the plurality of electrical connection structures electrically couples an electrical pad of a first active circuitry element of the plurality of active circuitry elements to a corresponding passive electrical component of the plurality of passive electrical components, and the first electrical connection structure is completely within the passivation structure.

2. The converter of claim 1, wherein each passive electrical component of the plurality of passive electrical components is selectively connectable with every passive electrical component of the plurality of passive electrical components.

3. The converter of claim 1, wherein a first passive electrical component of the plurality of passive electric components is permanently connected to a second passive electrical component of the plurality of passive electrical components.

4. The converter of claim 3, wherein the first passive electrical component is selectively connectable to a third passive electrical component of the plurality of passive electrical components.

5. The converter of claim 1, wherein the first active circuitry element and a second active circuitry element of the plurality of active circuitry elements are connected to a same side of the corresponding passive electrical component.

6. The converter of claim 1, wherein the first active circuitry element is between an input of the converter and the corresponding passive electrical component.

7. The converter of claim 1, wherein each passive electrical component of the plurality of passive electrical components comprises a capacitor.

8. A converter comprising:
a plurality of active circuitry elements over a substrate;
a passivation structure over the plurality of active circuitry elements, the passivation structure having at least one opening that is configured to expose at least one electrical pad of each active circuitry element of the plurality of active circuitry elements;
a plurality of passive electrical components over the passivation structure, wherein each passive electrical component of the plurality of passive electrical components is selectively connectable with at least one other passive electrical component of the plurality of electrical components, and a first side of each passive electrical component of the plurality of electrical components is electrically coupled to an electrical pad of each of at least two active circuitry elements of the plurality of active circuitry elements; and
a plurality of electrical connection structures, wherein a first electrical connection structure of the plurality of electrical connection structures electrically couples an electrical pad of a first active circuitry element of the plurality of active circuitry elements to a first passive electrical component of the plurality of passive electrical components, a second electrical connection structure of the plurality of electrical connection structures electrically couples an electrical pad of a second active circuitry element of the plurality of active circuitry elements to the first passive electrical component, and the first passive electrical component is between the first electrical connection structure and the second electrical connection structure.

9. The converter of claim 8, wherein the first active circuitry element is between an output of the converter and the first passive electrical component.

10. The converter of claim 8, wherein the first active circuitry element is connected to the first side of the first passive electrical component, the second active circuitry element is connected to a second side of the first passive electrical component, and a third active circuitry element of the plurality of active circuitry elements is connected to the first side of the first passive electrical component.

11. The converter of claim 8, wherein the first passive electrical component is connected in series with a second passive electrical component of the plurality of passive electrical components.

12. The converter of claim 8, wherein the first passive electrical component is selectively connectable in parallel with a second passive electrical component of the plurality of passive electrical components.

13. The converter of claim 8, wherein each passive electrical component of the plurality of passive electrical components is permanently connected to another passive electrical component of the plurality of passive electrical components.

14. The converter of claim 8, wherein the first passive electrical component is permanently connected to an input of the converter.

15. The converter of claim 8, wherein the first passive electrical component is permanently connected to an output of the converter.

16. A converter comprising:
a plurality of active circuitry elements over a substrate;
a passivation structure over the plurality of active circuitry elements, the passivation structure having at least one opening that is configured to expose at least one electrical pad of each active circuitry element of the plurality of active circuitry elements;
a plurality of passive electrical components over the passivation structure, wherein a first side of each passive electrical component of the plurality of electrical components is electrically coupled to an electrical pad of each of at least two active circuitry elements of the plurality of active circuitry elements; and
a plurality of electrical connection structures, wherein a first electrical connection structure of the plurality of electrical connection structures electrically couples an electrical pad of a first active circuitry element of the plurality of active circuitry elements to a first passive electrical component of the plurality of passive electrical components, a second electrical connection structure of the plurality of electrical connection structures electrically couples an electrical pad of a second active circuitry element of the plurality of active circuitry elements to the first passive electrical component, and the first electrical connection structure and the second electrical connection structure are both over the passivation structure.

17. The converter of claim 16, wherein the first passive electrical component comprises an inductor.

18. The converter of claim 17, wherein a second passive electrical component of the plurality of passive electrical components comprises a capacitor.

19. The converter of claim 16, wherein the first active circuitry element is connected to a first side of the first passive electrical component, and the second active circuitry element is connected to the first side of the first passive electrical component.

20. The converter of claim 16, wherein the first active circuitry element is between an input of the converter and the first passive electrical component.

* * * * *